US007666051B2

(12) United States Patent
Ren et al.

(10) Patent No.: US 7,666,051 B2
(45) Date of Patent: Feb. 23, 2010

(54) DEVICE AND METHOD FOR ACHIEVING ENHANCED FIELD EMISSION UTILIZING NANOSTRUCTURES GROWN ON A CONDUCTIVE SUBSTRATE

(75) Inventors: Zhifeng Ren, Newton, MA (US); Sung Ho Jo, Chestnut Hill, MA (US); Debasish Banerjee, Chestnut Hill, MA (US)

(73) Assignee: The Trustees of Boston College, Chestnut Hill, MA (US)

( * ) Notice: Subject to any disclaimer, the term of this patent is extended or adjusted under 35 U.S.C. 154(b) by 289 days.

(21) Appl. No.: 11/651,267

(22) Filed: Jan. 9, 2007

(65) Prior Publication Data

US 2007/0222353 A1    Sep. 27, 2007

Related U.S. Application Data

(63) Continuation of application No. PCT/US2005/025296, filed on Jul. 15, 2005.

(60) Provisional application No. 60/588,486, filed on Jul. 16, 2004.

(51) Int. Cl.
*H01J 9/00*       (2006.01)
*H01J 1/62*       (2006.01)

(52) U.S. Cl. .......................... 445/49; 313/311

(58) Field of Classification Search ......... 313/495–497, 313/310; 977/742; 445/49–51
See application file for complete search history.

(56) References Cited

U.S. PATENT DOCUMENTS

| 5,292,409 | A  | 3/1994  | Dixon et al. ............... 204/130 |
| 6,277,318 | B1 | 8/2001  | Bower et al. ............... 264/346 |
| 6,290,564 | B1 | 9/2001  | Talin et al. ................... 445/50 |
| 6,303,094 | B1 | 10/2001 | Kusunoki et al. ......... 423/447.1 |
| 6,414,444 | B2 | 7/2002  | Fox et al. .................. 315/169.3 |
| 6,538,367 | B1 | 3/2003  | Choi et al. .................. 313/309 |

(Continued)

FOREIGN PATENT DOCUMENTS

EP        1403953        3/2004

(Continued)

OTHER PUBLICATIONS

Bai, et al.; *Measuring the Work Function at a Nanobelt Tip and at a Nanoparticle Surface* Nano Letters, vol. 3, No. 8; pp. 1147-1150, Jun. 24, 2003.

(Continued)

*Primary Examiner*—Joseph L Williams
(74) *Attorney, Agent, or Firm*—Greenberg Traurig, LLP; David J. Dykeman

(57) ABSTRACT

A device and method is presented for achieving a high field emission from the application of a low electric field. More specifically, the device includes a substrate wherein a plurality of nanostructures are grown on the substrate. The relationship of the nanostructures and the substrate (the relationship includes the number of nanostructures on the substrate, the orientation of the nanostructures in relationship to each other and in relationship to the substrate, the geometry of the substrate, the morphology of the nanostructures and the morphology of the substrate, the manner in which nanostructures are grown on the substrate, the composition of nanostructure and composition of substrate, etc) allow for the generation of the high field emission from the application of the low electric field.

19 Claims, 16 Drawing Sheets

U.S. PATENT DOCUMENTS

| | | | |
|---|---|---|---|
| 6,689,439 B2 | 2/2004 | Sobolewski | 428/36.9 |
| 6,720,728 B2 | 4/2004 | Den et al. | 313/495 |
| 6,739,932 B2 | 5/2004 | Yaniv et al. | 445/24 |
| 6,743,408 B2 | 6/2004 | Lieber et al. | 423/447.1 |
| 6,753,108 B1 | 6/2004 | Hampden-Smith et al. | 429/44 |
| 6,755,956 B2 | 6/2004 | Lee et al. | 205/104 |
| 6,800,369 B2 | 10/2004 | Gimzewski et al. | 428/408 |
| 6,830,595 B2 | 12/2004 | Reynolds, III | 29/25.03 |
| 6,852,158 B2 | 2/2005 | Belmont et al. | 106/499 |
| 6,858,521 B2 | 2/2005 | Jin | 438/551 |
| 6,882,051 B2 | 4/2005 | Majumdar et al. | 257/746 |
| 6,882,094 B2 | 4/2005 | Dimitrijevic et al. | 313/346 R |
| 6,967,183 B2 | 11/2005 | Hampden-Smith et al. | 502/185 |
| 7,108,773 B2 | 9/2006 | Masel et al. | 204/252 |
| 7,125,822 B2 | 10/2006 | Nakano et al. | 502/339 |
| 7,189,472 B2 | 3/2007 | Suenaga et al. | 429/44 |
| 2001/0024078 A1* | 9/2001 | Dimitrijevic et al. | 313/311 |
| 2001/0036523 A1 | 11/2001 | Sobolewski | 428/36.9 |
| 2002/0076586 A1 | 6/2002 | Tanaka | 429/19 |
| 2002/0107140 A1 | 8/2002 | Hampden-Smith et al. | 502/101 |
| 2002/0176927 A1 | 11/2002 | Kodas et al. | 427/8 |
| 2002/0177032 A1 | 11/2002 | Suenaga et al. | 429/44 |
| 2003/0008192 A1 | 1/2003 | Freund et al. | 429/37 |
| 2004/0007161 A1 | 1/2004 | Belmont et al. | 106/499 |
| 2004/0018416 A1* | 1/2004 | Choi et al. | 429/44 |
| 2004/0045816 A1 | 3/2004 | Masel et al. | 204/290.14 |
| 2004/0072061 A1 | 4/2004 | Nakano et al. | 429/44 |
| 2004/0086772 A1 | 5/2004 | Chianelli et al. | 429/40 |
| 2004/0097371 A1 | 5/2004 | Jangbarwala | 502/439 |
| 2004/0101741 A1 | 5/2004 | Minteer et al. | 429/43 |
| 2004/0110057 A1 | 6/2004 | Yoshimoto et al. | 429/38 |
| 2004/0115516 A1 | 6/2004 | Miyake et al. | 429/42 |
| 2004/0120100 A1 | 6/2004 | Reynolds, III | 361/508 |
| 2004/0121122 A1 | 6/2004 | Reynolds, III et al. | 428/137 |
| 2004/0121220 A1 | 6/2004 | Ikoma | 429/44 |

FOREIGN PATENT DOCUMENTS

| | | |
|---|---|---|
| WO | WO 01/66217 | 9/2001 |
| WO | WO 02/27846 | 4/2002 |
| WO | WO 2004/019435 | 3/2004 |
| WO | WO 2004/036041 | 4/2004 |
| WO | WO 2004/051774 | 6/2004 |

OTHER PUBLICATIONS

Banjeree, et al., *Enhanced Field Emission of ZnO Nanowires* Advanced Materials, vol. 16, No. 22, pp. 2028-2032, Nov. 18, 2004.

Buldum, et al.; *Electron Field Emission Properties of Closed Carbon Nanotubes* Physical Review Letters, vol. 91, No. 23; pp. 236801-1-236801-4, Dec. 5, 2003.

Huang, et al.; *Catalytic Growth of Zinc Oxide Nanowires by Vapor Transport* Advanced Materials, vol. 13, No. 2; pp. 113-116, Jan. 16, 2001.

Jo, et al., *Field Emission of Zinc Oxide Nanowires Grown on Carbon Cloth* Applied Physics Letters, vol. 85, No. 8, pp. 1407-1409, Aug. 23, 2004.

Jo, et al.; *Field Emission of Carbon Nanotubes Grown on Carbon Cloth*; Applied Physics Letters, vol. 85, No. 5; pp. 810-812, Aug. 2, 2004.

Jo, et al.; *Field emission Studies on Thin Films of Zinc Oxide Nanowires*:Applied Physics Letters, vol. 83, No. 23; pp. 4821-4823, Dec. 8, 2003.

Klara et al., *Activated Carbon Cloth in Electrical Applications* Presented within the Plenary Lecture: Electric Energry Storage Applications at the 24th Biennial Conference on Carbon, Jul. 15, 1999.

Sveningsson et al., *Electron Field Emission from MultiWalled Carbon Nanotubes*, Carbon, vol. 42, pp. 1165-1168, Apr. 12, 2004.

Sveningsson et al., *Field Emission from Multi-Walled Carbon Nanotubes* Structural and Electronic Properties of Molecular Nanostructures, Edited by H. Kuzmany et al., American Institte of Physics, 663, pp. 548-551, 2002.

Sveningsson et al., *Highly Efficient Electron Field Emission from Decorated MultiWalled Carbon Nanotube Films*, Applied Physics Letters, vol. 85, No. 19, pp. 4487-4489, Nov. 8, 2004.

Wong et al., *Highly Efficient Field Emitter Using Carbon Nanotubes Grown by Microwave Plasma Enhanced CVD*, Diamond Materials VII, Electrochemical Society Proceedings, vol. 200-125, pp. 281-289, 2002.

International Search Report based on PCT/US05/25296 datedSep. 8, 2006.

* cited by examiner

FIG. 3A
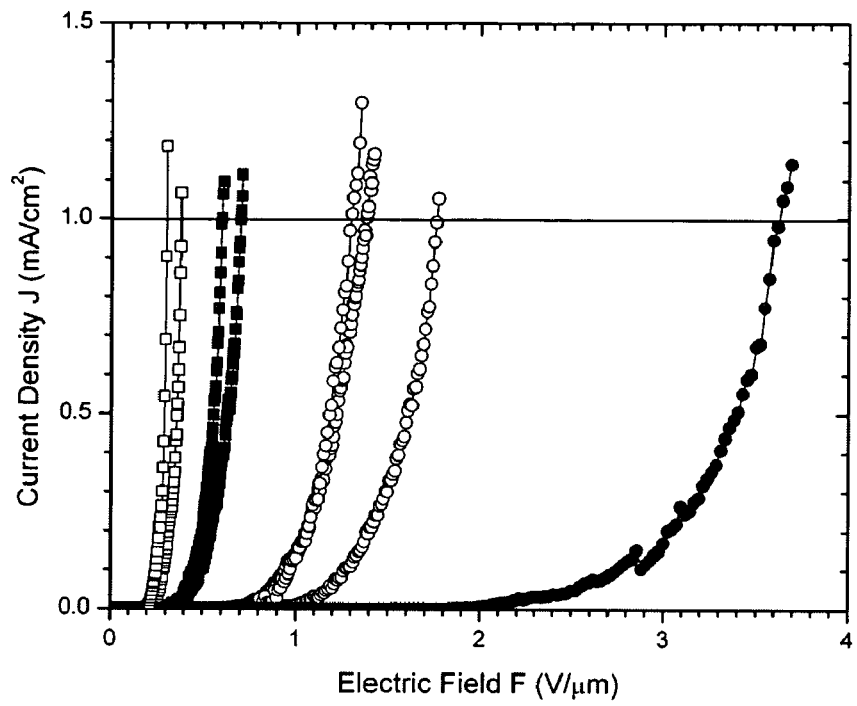
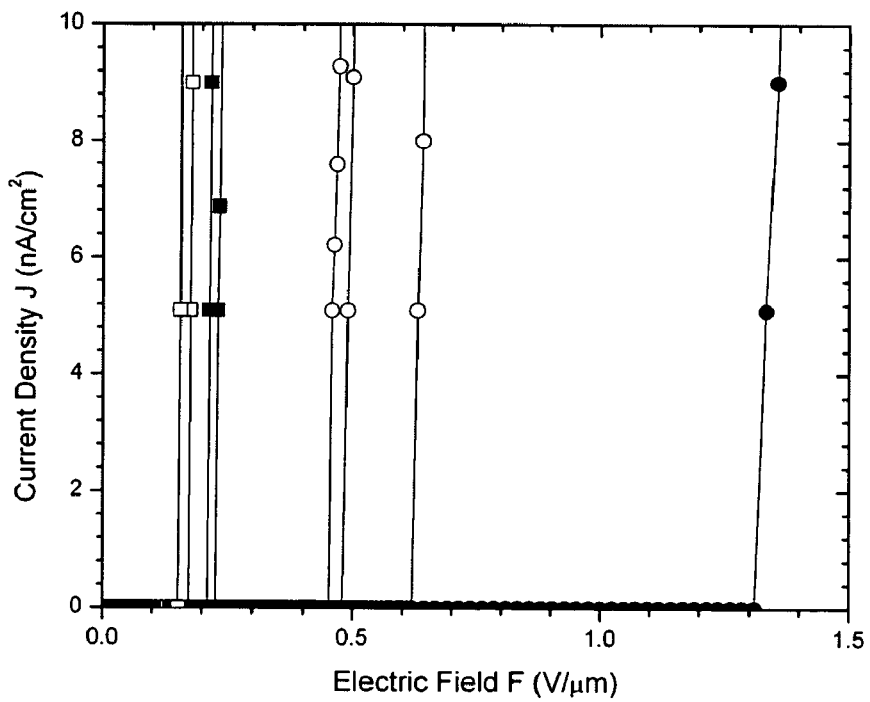
FIG. 3B

DEVICE AND METHOD FOR ACHIEVING ENHANCED FIELD EMISSION UTILIZING NANOSTRUCTURES GROWN ON A CONDUCTIVE SUBSTRATE

RELATED APPLICATIONS

This application is a continuation of PCT International Patent Application Number PCT/US2005/025296, filed Jul. 15, 2005, which claims the benefit of U.S. Provisional Application Ser. No. 60/588,486, filed Jul. 16, 2004, and the entirety of these applications are hereby incorporated herein by reference for the teachings therein.

GOVERNMENT SUPPORT

The invention was supported, in whole or in part, by grant no. DE-FG02-00ER45805 from the DOE, by grant no. NIRT 0304506 from the NSF, and grant no. DAAD16-03-C-0052 from the U.S. Army Research Development and Engineering Command, Natick Soldier Center. The Government has certain rights in the invention.

FIELD

The present invention relates to the generation of enhanced emission current density; more specifically, the invention presents the use of nanostructures grown on a substrate capable of enhanced emission current density at a low electric field.

BACKGROUND

The extraction of an appreciable field emission current at low applied electric field is technologically important to the vacuum microelectronic devices such as field emission displays. Although planar electron sources with large emission area typically have been fabricated from arrays of metal such as molybdenum or semiconductors such as silicon microtips, recently carbon-based materials such as carbon nanotubes, diamond, diamond-like carbon, etc., have been investigated as less expensive and simpler alternatives. Electron emissions at low electric fields have been observed from these carbon-based films, but a suitable emission current density still requires a relatively high electric field (about 1 V/µm). The use of such a high electric field presents several complications when attempting to incorporate these devices into the above-identified technologies.

As such, there remains a need in the art for a device capable of achieving an appreciable field emission current at low applied electric field.

SUMMARY

A device and method is presented for achieving a high field emission from the application of a low electric field. More specifically, the device includes a substrate wherein a plurality of nanostructures are grown on the substrate. The relationship of the nanostructures and the substrate (the relationship includes the number of nanostructures on the substrate, the orientation of the nanostructures in relationship to each other and in relationship to the substrate, the geometry of the substrate, the morphology of the nanostructures and the morphology of the substrate, the manner in which nanostructures are grown on the substrate, the composition of nanostructure and composition of substrate, etc) allow for the generation of the high field emission from the application of the low electric field.

The method achieves an enhanced field emission current density by providing a substrate, growing a plurality of nanostructures on the substrate and delivering an electric field to the carbon substrate. Particularly, a low electric field is delivered to the substrate.

In addition, a method is presented for providing an enhanced field emission current density wherein the method includes providing a conductive substrate, growing a plurality of nanostructures on the carbon substrate via a carbothermal vapor transport and condensation approach and delivering an electric field to the carbon substrate. In an embodiment, the nanostructures are zinc oxide nanostructures.

Further, a device is presented wherein the device achieves an enhanced field emission current density. The device comprises a carbon substrate wherein a plurality of nanostructures are grown on the carbon substrate. The quantity, alignment and position of the nanostructures on the carbon substrate provide for the enhanced field emission current density.

BRIEF DESCRIPTION OF THE DRAWINGS

The present invention will be further explained with reference to the attached drawings, wherein like structures are referred to by like numerals throughout the several views. The drawings shown are not necessarily to scale, with emphasis instead generally being placed upon illustrating the principles of the present invention.

In FIG. 2A, FIG. 2C, FIG. 2E and FIG. 2G, the white scale bars represent 10 µm. In FIG. 2B, FIG. 2D, FIG. 2F and FIG. 2H, the white scale bars represent 1 µm.

FIG. 3 shows a graph of the field emission current density dependencies on electric field (J-F) for various combinations of substrates and nanostructures.

FIG. 6A and FIG. 6B show a low magnification (FIG. 6A) and a high magnification (FIG. 6B) TEM micrograph of carbon nanotubes grown on a carbon cloth. FIG. 6C and FIG. 6D show a low magnification (FIG. 6C) and a high magnification (FIG. 6D) TEM micrograph of carbon nanotubes grown on a Cr-coated carbon cloth. FIG. 6E and FIG. 6F show a low magnification (FIG. 6E) and a high magnification (FIG. 6F) TEM micrograph of carbon nanotubes grown on graphite foil.

FIG. 11A and FIG. 11B show a low magnification (FIG. 11A) and a high magnification (FIG. 11B) SEM micrograph of the carbon cloth before the nanostructure growth. FIG. 11C and FIG. 11D show a low magnification (FIG. 11C) and a high magnification (FIG. 11D) SEM micrograph of "type A" samples showing the non-uniform long length and high density. FIG. 11E-FIG. 11F show a low magnification (FIG. 11E) and a high magnification (FIG. 11F) SEM micrograph of "type B" samples showing the uniform long length and high density. In FIG. 11A, the scale bar is 100 µm. In FIG. 11B, FIG. 11C, FIG. 11D, and FIG. 11E, the scale bar is 10 µm. In FIG. 11F, the scale bar is 2 µm.

FIG. 12A and FIG. 12B show a low magnification (FIG. 12A) and a high magnification (FIG. 12B) SEM micrograph of "type C" samples to illustrate the low density and long length of these samples. FIG. 12C and FIG. 12D show a low magnification (FIG. 12C) and a high magnification (FIG. 12D) of "type D" samples to illustrate these short nanorods with non-uniform density. FIG. 12E and FIG. 12F show a low magnification (FIG. 12E) and a high magnification (FIG. 12F) SEM micrograph of "type E" samples to illustrate the small ZnO nanocluster on the surface. In FIG. 12A, the scale bar is 10 µm. In FIG. 12B, the scale bar is 2 µm. In FIG. 12C and FIG. 12D, the scale bar is 1 µm. In FIG. 12E, the scale bar is 10 µm. In FIG. 12F, the scale bar is 2 µm.

Figure 1:
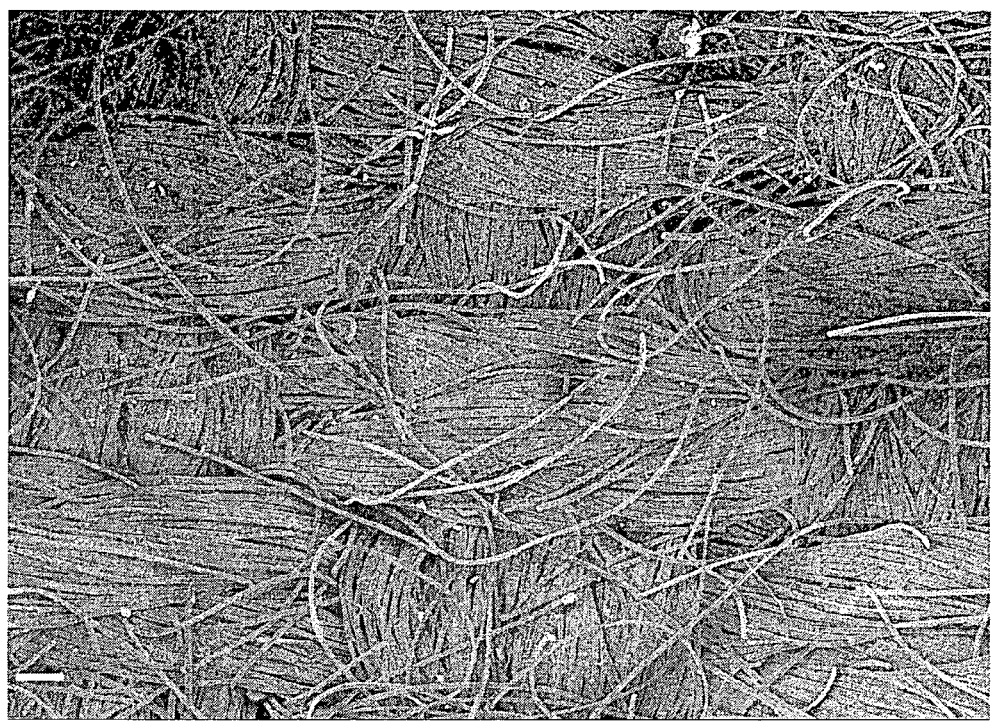
FIG. 1 shows a scanning electron microscope (SEM) image of the overall morphology of a carbon cloth.

While the above-identified drawings set forth certain embodiments of the present invention, other embodiments of the present invention are also contemplated, as noted in the discussion. This disclosure presents these illustrative embodiments by way of representation and not limitation. Numerous other modifications and embodiments can be devised by those skilled in the art which fall within the scope and spirit of the principles of the present invention.

DETAILED DESCRIPTION

A device and method is presented for achieving a high field emission from a low electric field. The device includes a substrate wherein a plurality of nanostructures are grown on the substrate. Once the nanostructures have grown on the substrate, an electric field is applied to the substrate and achieves a particular emission current density.

The device provides for a high emission current density to be produced by a low electric field. For example, the device and method allows for an emission current density of about 1 mA/cm² via an application of an electric current of as low as about 0.7 V/µm.

The device includes a substrate wherein a plurality of nanostructures have been grown on the substrate. In an embodiment, the substrate comprises carbon. In an embodiment, the substrate is a carbon cloth. The carbon cloth includes a plurality of carbon fibers. In an embodiment, the carbon fibers are oriented in at least two directions. The carbon cloth has a woven geometry. The surface of the substrate has a rough finish.

In an embodiment, the substrate includes a conducting material. In an embodiment, the substrate comprises gold. In an embodiment, the substrate comprises aluminum. In an embodiment, the substrate comprises silver. In an embodiment, the substrate comprises copper. In an embodiment, the substrate comprises zinc. In an embodiment, the substrate comprises gallium. In an embodiment, the substrate comprises indium. In an embodiment, the substrate comprises thallium. In an embodiment, the substrate comprises tin. In an embodiment, the substrate comprises antimony. In an embodiment, the substrate comprises bismuth. Those skilled in the art will recognize that a substrate comprising any conducting material is within the spirit and scope of the present invention.

As stated, the device comprises a plurality of nanostructures grown on a substrate. In an embodiment, the nanostructures comprise carbon. In an embodiment, the nanostructures comprise non-carbon materials. In an embodiment, the nanostructures comprise zinc oxide.

In an embodiment, the nanostructures are nanotubes. In an embodiment, the nanostructures are nanowires. In an embodiment, the nanostructures are nanorods. In an embodiment, the nanostructures are single-wall carbon nanostructures. In an embodiment, the nanostructures are multi-walled nanostructures. Those skilled in the art will recognize that various nanostructrues are within the spirit and scope of the present invention.

In an embodiment, the nanostructures are grown on the substrate via a carbothermal vapor transport approach. Such an approach allows for a predictable quantity, alignment, density and morphology of the nanostructures. Those skilled in the art will recognize that any process for growing nanostructures capable of such predictability is within the spirit and scope of the present invention.

The nanostructures on the substrate are grown to a desired density. As used herein, density means the amount of nanostructures grown on a substrate and the proximity of the nanostructures relative to each other. As will be discussed in the examples below, the nanostructure density is an important variable in achieving a desired emission density. Very dense nanostructures on a substrate may have a negative impact on the emission spectra.

In addition, the nanostructures are grown to a desired length. As will be discussed in the examples below, the nanostructure length is an important variable in achieving a desired emission density. The process used to grow the nanostructures on the substrate must be a process capable of growing nanostructures on the substrate at a predictable length and predictable density.

A field enhancement factor is defined as the ratio of a local electric field at the tip of nanostructures in relation to the macroscopic electric field. The device and method presented herein produced a field enhancement factor of about $4 \times 10^4$. Such a field enhancement factor is substantially higher than previously reported devices. The combination of the nanostructures and the substrate are responsible for this field enhancement factor. Particularly, the use of zinc oxide nanostructures grown on a substrate provide a field enhancement factor of about $4\times10^4$.

The following examples are meant to further illustrate the presently disclosed device and method. These examples are in no way meant to limit the scope of the present disclosure. Those skilled in the art will recognize that several variations to the device and method are clearly within the spirit and scope of the present invention.

EXAMPLES

Example 1

Nanostructural Electron Emissive Materials

The present example discloses a study of field emission from carbon nanotubes grown on a carbon cloth. With use of an embodiment of the present device, an extremely low electric field of less than about 0.4 V/μm was required to achieve an emission current density of about 1 mA/cm². This ultralow operating electric field of carbon nanotubes grown on carbon cloth is mainly due to a very high field enhancement of about $1.882\times10^4$, which is the result of geometrical configuration of the nanostructures and the substrate. This field enhancement factor is even higher than that of a macroscopic tungsten tip, even though the nanostructures (i.e., carbon nanotubes) grown on the substrate (i.e., carbon cloth) are planar field emitters. In addition to the field enhancement, the highly disordered microstructure of carbon nanotubes grown on carbon cloth plays an important role to field emission. This unexpected result indicates that the roughness of the substrates on which carbon nanotubes grow is material. This result may be utilized in practical application such as highly efficient lamps, field emission displays, micro vacuum electron sources, etc.

The embodiment used for the current example utilized a carbon cloth as a substrate. Carbon cloth is a woven sheet of carbon fiber bundles, as shown in FIG. 1. FIG. 1 shows a scanning electron microscopy (SEM) micrograph showing an overall morphology of carbon cloth. The white scale bar represents 100 μm. Even though carbon cloth is mechanically unstable, a large area field emission flat cathode can be made of the carbon cloth if the carbon cloth has good field emission properties.

The present example reports excellent field emission current density of about 1 mA/cm² at a field of less than about 0.4 V/μm from nanostructures grown on carbon cloth. In this example, carbon nanotubes were grown on the carbon cloth. The results are of great interest to technological applications such as field emission displays, microvacuum electron sources, etc., since the operating voltage can be significantly reduced.

In this example, commercially available carbon cloth was used as a starting material. Before the carbon nanotube growth, an about 30-nm-thick stainless steel (type 304) film was deposited as catalyst on the carbon cloth by dc magnetron sputtering. Carbon nanotubes growth was carried out in a tube furnace by a thermal chemical vapor deposition technique. The catalyst layer was first heat-treated at about 660° C. in about 50 Torr of flowing mixture of $H_2$ (10 sccm, 99.999% purity) and $N_2$ (100 sccm, 99.998% purity) for about 1.5 hours to form the required catalyst particles and to enhance the catalyst activity, then the pressure was adjusted to 0.9 Torr by controlling the exhaust valve, and the hydrogen was replaced with $C_2H_2$ (10 sccm, 99.6% purity) for carbon nanotube growth for 1 hours. Some carbon cloths were coated with chromium (Cr) before the stainless steel film deposition. Graphite foil was also substituted as a substrate on which to grow the carbon nanotubes in order to investigate the effect of the surface roughness of substrate on field emission properties.

Figure 2:
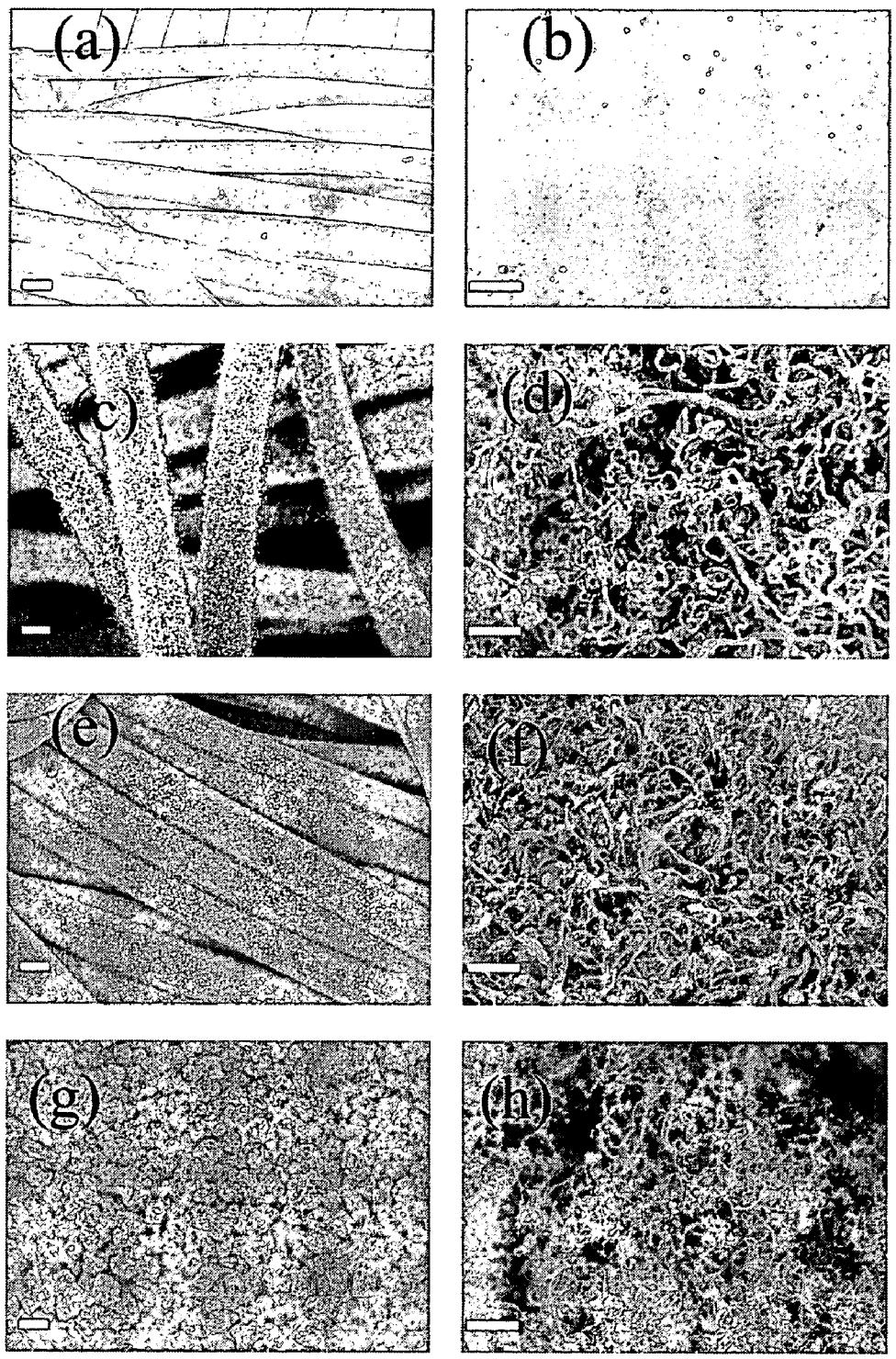
FIG. 2A and FIG. 2B show a low magnification (FIG. 2A) and a high magnification (FIG. 2B) SEM micrograph of a carbon cloth.
FIG. 2C and FIG. 2D show a low magnification (FIG. 2C) and a high magnification (FIG. 2D) SEM micrograph of a carbon nanotube grown on the carbon cloth.
FIG. 2E and FIG. 2F show a low magnification (FIG. 2E) and a high magnification (FIG. 2F) SEM micrograph of a carbon nanotube grown on a chromium (Cr)-coated cloth.
FIG. 2G and FIG. 2H show a low magnification (FIG. 2G) and a high magnification (FIG. 2H) SEM micrograph of carbon nanotubes grown on graphite foil.

Scanning electron microscopy (SEM) was employed to examine the carbon cloth, the carbon nanotubes grown on the carbon cloth, the carbon nanotubes grown on the Cr-coated carbon cloth, and the carbon nanotubes grown on graphite foil. FIG. 2A-FIG. 2H show the low and high magnification images. Although the overall surface of each carbon fiber in carbon cloth is quite smooth in low magnification (see FIG. 2A), several irregularities appear in high magnification (see FIG. 2B). These appear to be the potential emitting centers. The overall surfaces of other samples are rough as shown in FIG. 2C, FIG. 2E and FIG. 2G, and the carbon nanotubes grown on these substrates are heavily tangled, bent, and kinked (see FIG. 2D, FIG. 2F, and FIG. 2H.)

Field emission measurement was carried out in a high vacuum chamber ($<3\times10^{-7}$ Torr) using a simple diode configuration with a 5-mm-diameter cylindrical anode and a gap of about 0.26, 1, 2, and 3 mm depending on the sample. The field emission current density dependencies of electric field (J-F) measured from various samples are shown in FIG. 3. FIG. 3A and FIG. 3B show the field emission current density dependencies of electric field (J-F) in (as shown in FIG. 3A) the high emission current density region showing operating electric field and (as shown in FIG. 3B) low current density region showing turn-on electric field from carbon nanotubes grown on carbon cloth (represented by an open square), carbon nanotubes grown on Cr-coated carbon cloth (represented by a solid square), carbon cloth (represented by an open circle), and carbon nanotubes grown on graphite foil (represented by a solid circle).

From FIG. 3A, the average operating electric fields for the carbon cloth, the carbon nanotubes grown on carbon cloth, the carbon nanotubes grown on Cr-coated carbon cloth, and the carbon nanotubes grown on graphite foil are determined to be about 1.48, 0.34, 0.65, and 3.62 V/μm, respectively.

In FIG. 3B, the emission current density dependencies of electric field in the low current density region, which indicates the turn-on electric field-less than about 0.2 V/μm.

Figure 4:
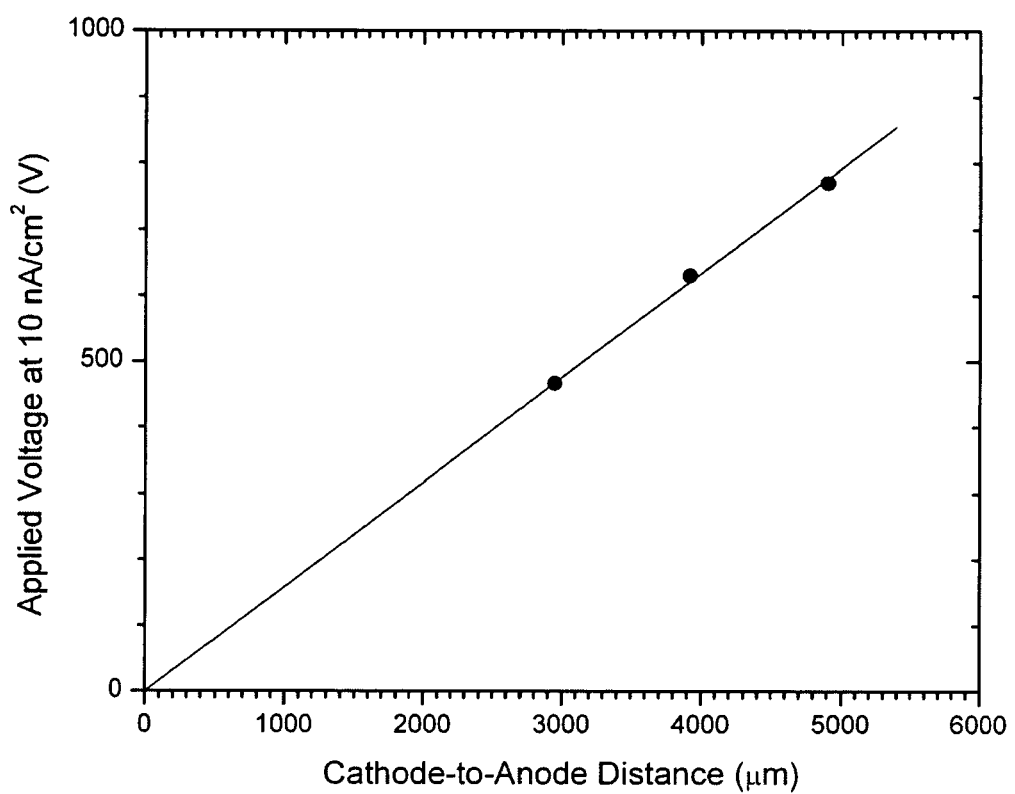
FIG. 4 shows a graph of a turn-on voltage dependence on a cathode-to-anode gap distance (µm).

In order to justify the accuracy of calculation of turn-on electric field, the applied voltage corresponding to about 10 nA/cm² is measured at different cathode-to-anode gaps (2948, 3918, 4904 μm). The result are shown in FIG. 4, and it can be seen that the measured data fit well to a line passing through zero, indicating that the possible error in the estimation of gap is negligible.

Figure 5:
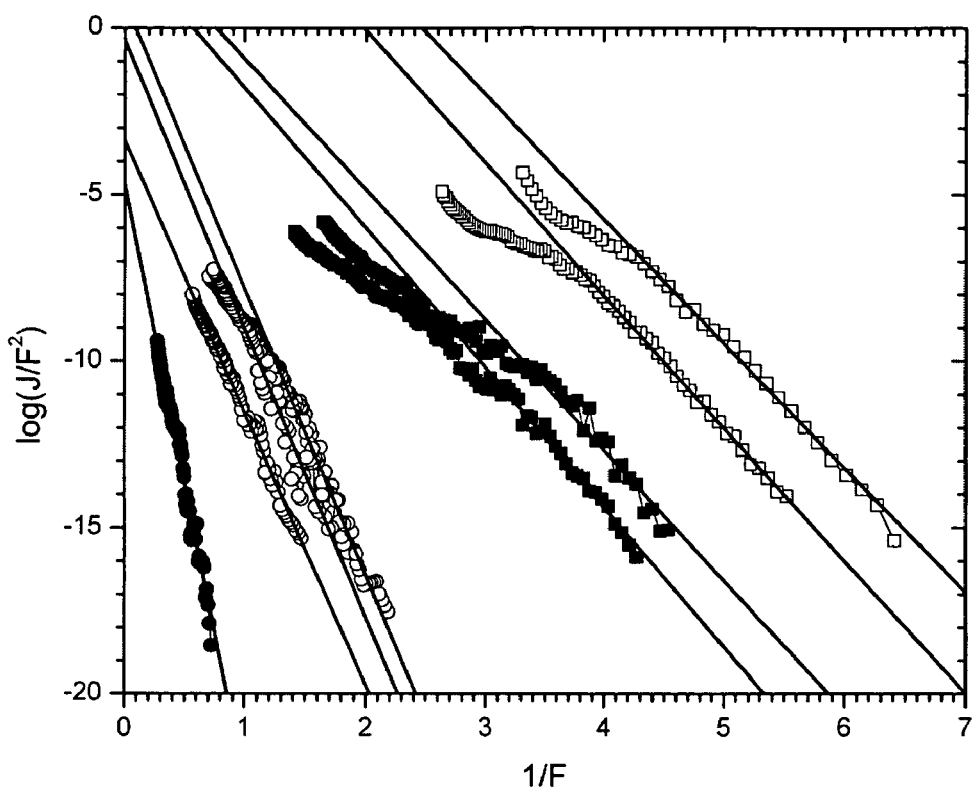
FIG. 5 shows Fowler-Nordheim (F-N) plots for carbon nanotubes grown on carbon cloth (as represented by an open box), carbon nanotubes grown on Cr-coated carbon cloth (as represented by a solid box), carbon cloth (as represented by an open circle), and carbon nanotubes grown on graphite foil (as represented by a solid circle).

The Fowler-Nordheim (FN) plots for the various samples are shown in FIG. 5. FIG. 5 shows FN plots for carbon nanotubes grown on carbon cloth (represented by an open box), carbon nanotubes grown on Cr-coated carbon cloth (which is represented as a solid box), carbon cloth (represented as an open circle), and carbon nanotubes grown on graphite foil (represented as a solid box). The average intercepts of FN plots, which are indicative of the emitting area, and the average field enhancement factors for the various samples are listed in Table I below:

TABLE I

The average intercepts of FN plots and
the average field enhancement factors

| Sample | Average Intercept | Average Field Enhancement Factor |
|---|---|---|
| Carbon Cloth | −0.9945 | $0.857 \times 10^4$ |
| Carbon nanotubes grown on Carbon Cloth | 8.5445 | $1.882 \times 10^4$ |
| Carbon nanotubes grown on Cr-coated carbon cloth | 2.6840 | $1.791 \times 10^4$ |
| Carbon nanotubes Grown on Graphite Foil | −4.7050 | $0.407 \times 10^4$ |

The field enhancement factor can be calculated from the slope of FN plot since $\log(J/F^2)=\log(A\gamma^2/\phi)-B\phi^{3/2}/\gamma F$, where $A=1.54\times10^{-6}$ A eV $V^{-2}$, $B=6.83\times10^9$ eV$^{-3/2}$ Vm$^{-1}$, $\gamma$ is the field enhancement factor, and $\phi$ is the work function. It was assumed $\phi=5$ eV as for graphite. It is very surprising to see that the carbon cloth itself is very good planar field emitter comparable with the result reported for carbon nanotubes. In fact, it is too high to be explained from the geometry of the carbon fibers with diameters of about 10 µm. It is even surprising that the carbon nanotubes grown on the carbon cloth showed much lower operating electric field of less than 0.4 V/µm as shown in FIG. 3. Therefore, the unexpected and improved field emission is due to the presence of carbon nanotubes that caused the increase of the number and the sharpness of the emission sites. This is based on the increase of average intercept (−0.9945 to 9.5445) of FN plots and the increase of average field enhancement factor ($0.857\times10^4$ to $1.882\times10^4$). These results are confirmed by the SEM image of the carbon nanotubes grown on carbon cloth (as shown in FIG. 2C and FIG. 2D). The field enhancement factor of the carbon nanotubes grown on the carbon cloth is much higher than those of the single-wall and multiwall carbon nanotube films (about $1.1\times10^4$) and is also a little higher than that of single tungsten wire field emitter (about $1.8\times10^4$).

Figure 6:
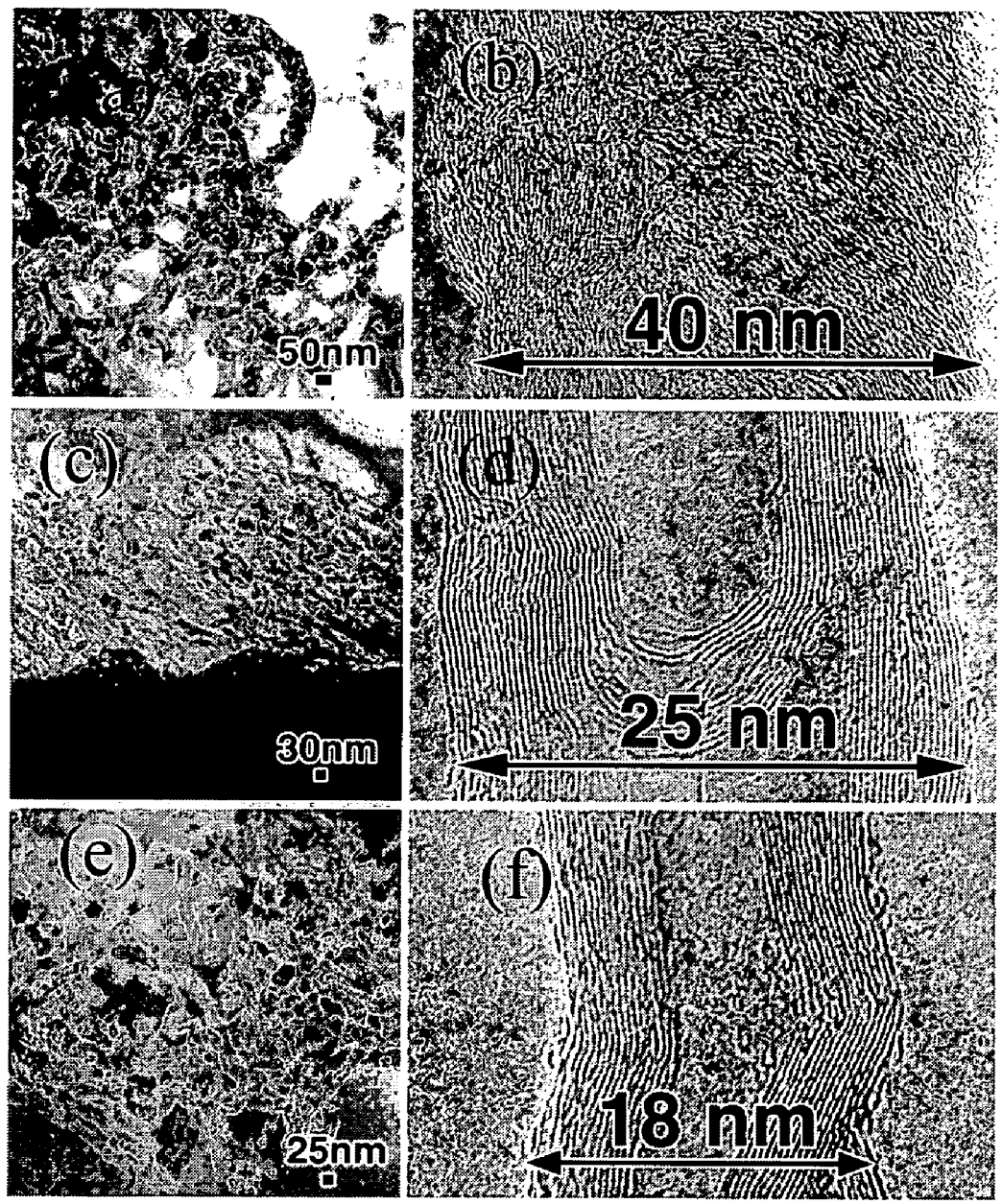
FIG. 6A-FIG. 6F show transmission electron microscope (TEM) micrographs of various nanostructures grown on various substrates.

The field emission properties cannot be explained solely by the field enhancement of the carbon nanotubes. This is because of the field enhancement factor calculated from the slope of the FN plot for the carbon nanotube grown on smooth graphite foil is only about $0.407\times10^4$, even though the average diameter of the carbon nanotubes grown on graphite foil (about 25 nm as shown in FIG. 6E and FIG. 6F) is smaller than that on carbon cloth (about 50 nm as shown in FIGS. 6A and 6B). Smaller diameter normally means higher enhancement factor. As such, these results show the overall field enhancement is dependent not only on the carbon nanotube itself but also on the morphology of the substrate on which the carbon nanotubes grow. Therefore the field emission properties of the carbon nanotubes grown on carbon cloth are a combined result of the field enhancement from carbon nanotubes and carbon cloth.

From careful examination of the microstructure of the carbon nanotubes grown on different substrates using transmission electron microscope (TEM), it was found that carbon nanotube qualities such as crystallinity, graphitization, and defects also play an important role in field emission. Very surprisingly, the carbon nanotubes grown on carbon cloth that showed the best field emission property have very poor crystallinity, high density of bamboo structure, and amorphous phases (as shown in FIG. 6A and FIG. 6B) compared to those grown on Cr-coated carbon cloth (as shown in FIG. 6C and FIG. 6D). The graphite layers in FIG. 6B are not continuous and inclined to the tube axis, which are detrimental to the electron transport and therefore should yield worse field emission property according to the conventional knowledge. Based on this, it is believed that high defect density as shown in FIG. 6B is very favorable to field emission. This is further illustrated by the carbon nanotubes grown on graphite foil that showed much worse field emission property but much better graphitization, and clear parallel graphite layers in the tube walls (see FIG. 6F). As such, these results disclose that defect density play a role in field emission properties of the device in addition to geometrical configuration of the nanostructures and the substrate.

Therefore, this example discussed field emission from nanostructures grown on carbon cloth. The emission current of about 1 mA/cm² was observed at a field of about 0.34 V/µm. This field emission properties result from the combined effect of the field enhancement from carbon nanotubes and carbon cloth. In addition, the field emission properties are partly due to the highly defective structure of carbon nanotubes on the carbon cloth.

Example 2

Field Emission of Zinc Oxide Nanowires Grown on Carbon Cloth

The following example discusses the use nanostructures comprising zinc oxide. In this example, an extremely low operating electric field was achieved through the use of zinc oxide (ZnO) nanostructures grown on carbon cloth. Thermal vaporization and condensation was used to grow the nanostructures (i.e., nanowires) from a mixture source of ZnO and graphite powders in a tube furnace. An emission current density of about 1 mA/cm² was obtained at an operating electric field of about 0.7 V/µm. Such low field results from an extremely high field enhancement factor of about $4.11\times10^4$ due to a combined effect of the high intrinsic aspect ration of ZnO nanowires and the woven geometry of carbon cloth.

Figure 7:
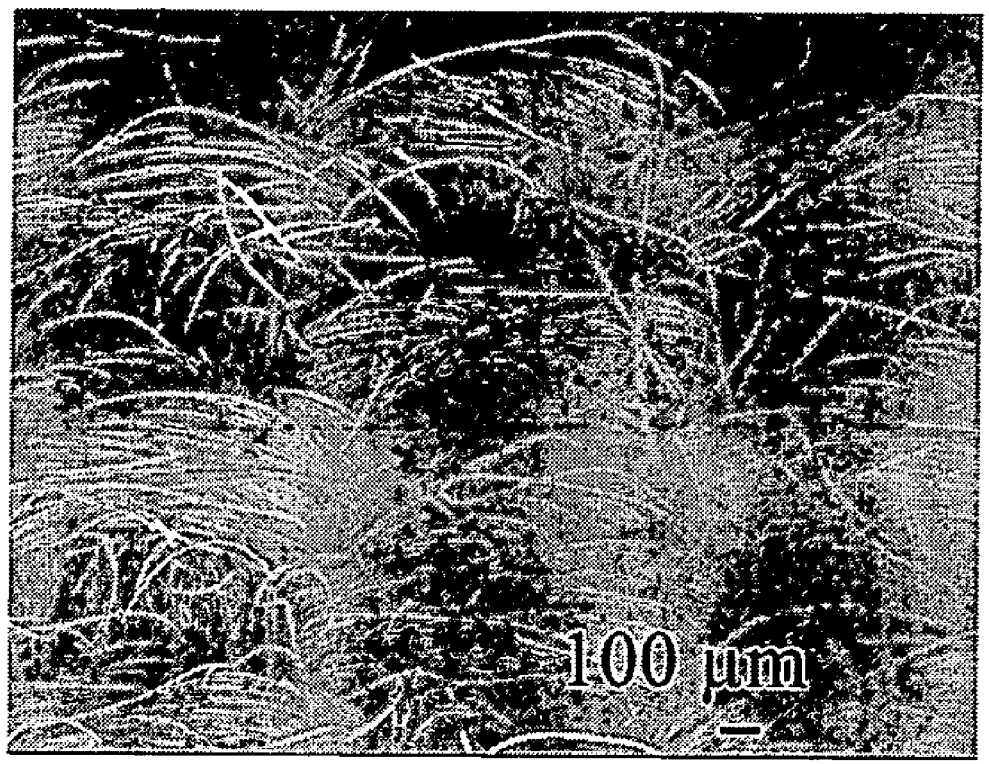
FIG. 7 shows an SEM image of a carbon cloth.

In order to achieve a lower electric field (below about 4 V/µm), carbon cloth was utilized as a substrate on which ZnO nanowires were grown because superior field emission was observed from carbon nanotubes grown on carbon cloth (see Example 1). Carbon cloth is a woven textile material consisting of carbon fibers oriented in two directions, as shown in FIG. 7. The carbon fibers of about 10 µm in diameter in carbon cloth have good conductivity. Due to the woven nature of carbon cloth, it provides additional field enhancement to the intrinsic field enhancement of ZnO nanowires due to their high aspect ration.

The ZnO nanowires were synthesized on carbon cloth by vaporization and condensation. A mixture source of ZnO powder (Alfa Aesar, 99.9%) and graphite powder (Alfa Aesar, 99.9%) was loaded at the higher temperature zone and the carbon cloth was placed in the lower temperature zone of a horizontal tube furnace. The furnace was heated up to about 1100° C. at a rate of about 50° C./min and kept for about 25 minutes with a pressure of about 2 Torr maintained by a constant Argon gas flow of about 50 sccm. The temperature where the carbon cloth was placed was about 725° C. to about 750° C. Since no catalysts were used, the ZnO nanowires were grown following the vapor-solid or the self-catalyzing growth mechanism. In this process, the zinc and zinc suboxide vapor were produced by carbothermal reduction and subsequently condensed in the lower temperature zone as the catalyst on which the ZnO nanowires were grown.

Figure 8:
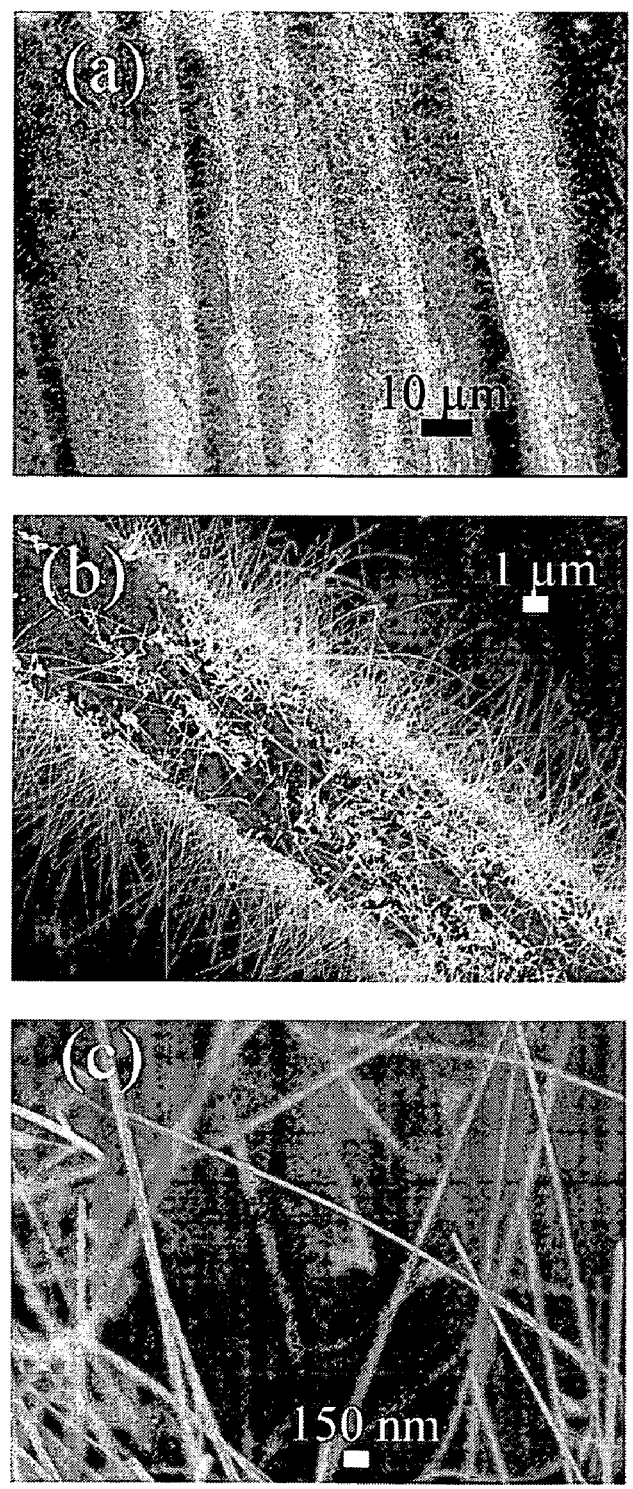
FIG. 8A-FIG. 8C show an SEM micrograph of ZnO grown on carbon cloth at a low magnification (FIG. 8A), a medium magnification (FIG. 8B) and a high magnification (FIG. 8C).

FIG. 8A-FIG. 8C show various scanning electron microscope (SEM) images of the ZnO nanowires grown on carbon cloth. FIG. 8A shows a low magnification image. FIG. 8B shows a medium magnification image. FIG. 8C shows a high magnification image. The nanowires are of about 5 μm in length to about 10 μm in length as shown in FIG. 8B and of about 50 nm in diameter as shown in FIG. 8C. As illustrated, the surface of the carbon fibers is partially covered by ZnO nanowires. The low density due to the partial coverage is beneficial to field enhancement factor because it reduces the screening effect usually observed in the high density nanotube and nanowire films.

Figure 9:
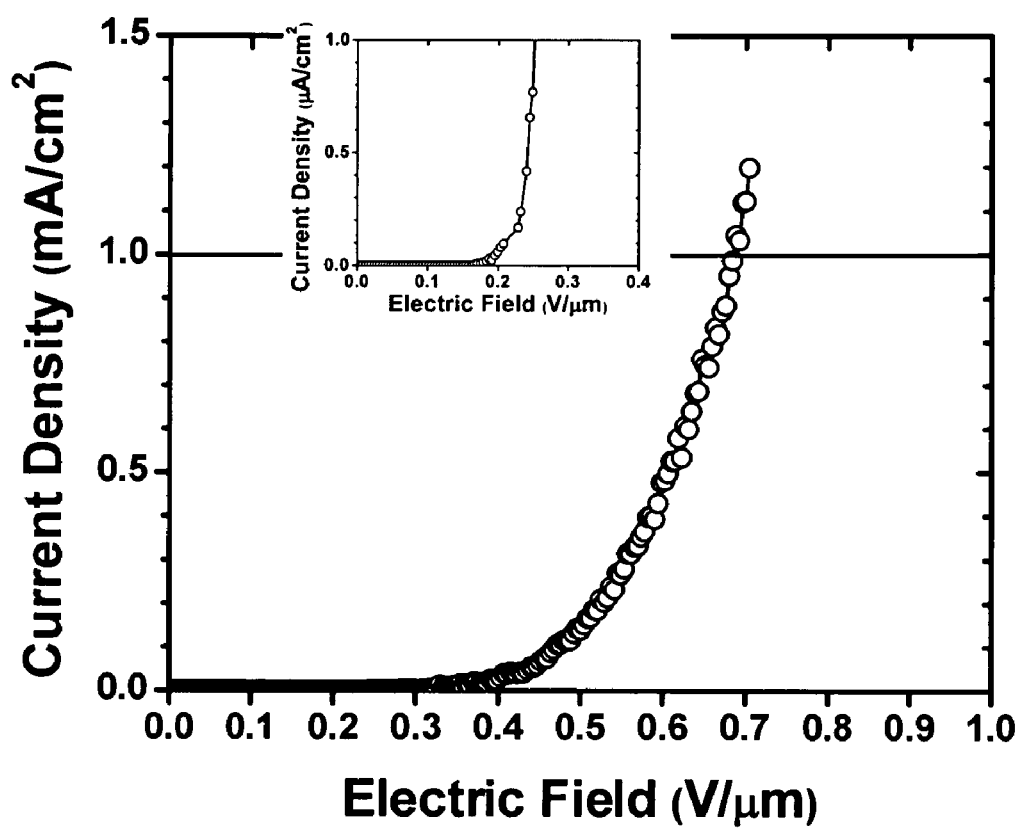
FIG. 9 shows a graph of a measured field emission current density zinc oxide (ZnO) nanowires grown on carbon cloth as a function of the macroscopic electric field.

The field emission current of the ZnO nanowires grown on carbon cloth was measured using a simple planar diode configuration. The anode was a molybdenum disk with a diameter of about 5 mm, and the gap between the carbon cloth and the anode was about 2.5 mm. The vacuum level was kept below about $1 \times 10^{-6}$ Torr during measurement. A graph of the measured current density as a function of the macroscopic electric field is shown in FIG. 9. A turn-on electric field of about 0.2 V/μm was obtained at an emission density of about 0.1 μA/cm$^2$ (as shown in the inset of FIG. 9). A horizontal line at the emission current density of about 1 mA/cm$^2$ was drawn to determine the electric field to be about 0.7 V/μm.

Figure 10:
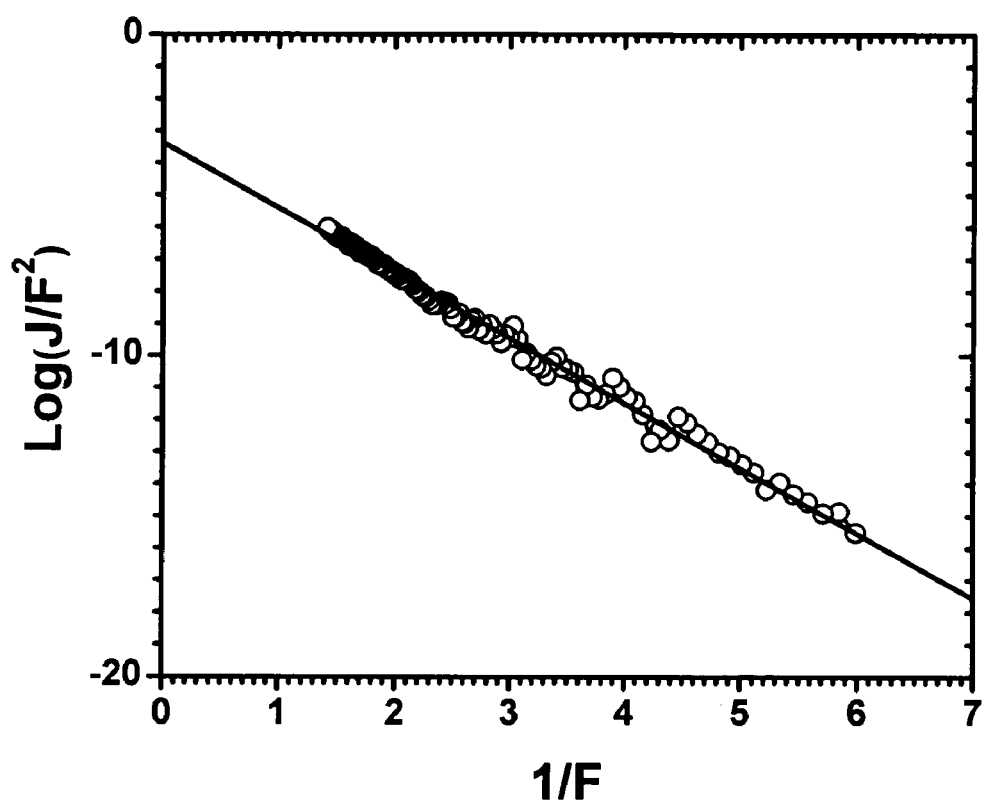
FIG. 10 shows a Fowler-Nordheim plot of the field emission current density of ZnO nanowires grown on carbon cloth.

The Fowler-Nordheim (F-N) plot for the measured sample is shown in FIG. 10. It is clearly shown that the measured data fit well to the linear relationship given by $$\log(J/F^2)=\log(A\gamma^2/\phi)-B\phi^{3/2}/\gamma F,$$

where $A=1.54 \times 10^{-6}$ A eV V$^{-2}$, $B=6.83 \times 10^9$ eV$^{-3/2}$ Vm$^{-1}$, $\gamma$ is the field enhancement factor, and $\phi$ is the work function of the emitter material. Assuming $\phi=5.3$ eV as for ZnO, a field enhancement factor was calculated to be about $4.11 \times 10^4$ from the slope of the straight line in FIG. 10. This is a higher value than was found for single-wall and multi-wall carbon nanotube films (about $1.1 \times 10^4$), single tungsten wire field emitter (about $1.8 \times 10^4$), and carbon nanotubes on carbon cloth.

The intrinsic field enhancement factor of an individual nanowire is approximately proportional to the aspect ratio of l/r, where l and r are the length and radius of nanowire, respectively. Since the length and radius of ZnO nanowires are about 10 μm and about 25 nm, respectively, the intrinsic field enhancement factor of ZnO nanowires is calculated to be only about $4 \times 10^3$, which is an order of magnitude smaller than the experimental value. Therefore, the high field enhancement factor of ZnO nanowires grown on carbon cloth is believed to be the result of a combined effect of the intrinsic geometry of the ZnO nanostructures and that of carbon cloth. Since the protruding carbon fibers of the carbon cloth have an average radius of about 5 μm and a length in the order of about 100 μm, as shown in FIG. 7, a field enhancement factor of about 100 for the protruding carbon fiber is estimated. This field enhancement of the protruding carbon fiber was further enhanced by the ZnO nanowires by about $4 \times 10^2$, leading to a combined field enhancement factor of about $4 \times 10^4$, which is similar to the experimental value as measured.

In summary, this example illustrates an electric field of as low as 0.7 V/μm is needed to obtain an emission current density of about 1 mA/cm$^2$ of zinc oxide nanowires grown on carbon cloth. It is the lowest ever reported operating field for ZnO nanowires.

Example 3

Enhanced Field Emission of ZnO Nanowires

In this example, ultrahigh field emission from ZnO nanostructures grown on a substrate were obtained by growing the ZnO nanowires on a carbon cloth via a carbothermal vapor transport and condensation approach. With this device, an emission current density of about 1 mA/cm$^2$, which is a reasonable value for sufficient brightness for a field emission based Video Graphics Array (VGA) screen display, can be achieved at an electric field of about 0.7 V/μm. The field enhancement factor, which is defined as the ratio of the local electric field at the tip of the nanowires to the macroscopic electric field, is about $4 \times 10^4$. As stated in the previous examples, carbon cloth, which is a textile material consisting of long carbon fibers (each of about 10 μm in diameter) oriented at least in two directions, has a material contribution to the high field enhancement factor.

The growth of ZnO nanowires on carbon fibers follows the a vapor-solid self-catalyzing mechanism as for gram quantity production of ZnO nanowires using graphite flakes as a collector. It is of note that these results show that ZnO nanostructures grow easily on a micro curvature surface, different from the growth of flat surfaces. For samples located at different temperature zones with different growth times, five different kinds of morphologies and site densities of nanowires on the carbon fiber surface. These were categorized as A, B, C, D and E. These basic morphological features are listed below in Table II below:

TABLE II

Growth Conditions, Morphology, and Densities of Various Nanowires Grown on Carbon Cloth

| Type | Morphological Features | Temp. (° C.) | Growth Time (min) |
|---|---|---|---|
| A | Non uniform length (10-15 μm), high density | 700 | 25-45 |
| B | Uniform length (7-8 μm), high density | 650 | 45 |
| C | Non uniform length (5-10 μm), low density | 725-750 | 15-45 |
| D | Non uniform length (0.5-1 μm), low density | 650 | 25 |
| E | Nanoclusters, low density | 650 | 15 |

As listed in Table II, type A includes high density and non-uniform length between about 10 μm to about 15 μm grown at about 700° C.; type B includes high density and uniform lengths of about 7 μm to about 8 μm grown at about 650° C.; type C includes low density and non-uniform length ranging from about 5 μm to about 10 μm grown at about 725° C. to about 750° C.; type D includes low density, very short nanorods grown at about 650° C.; and type E includes low density nanoclusters grown at about 650° C. The clear differences between type A morphology and type B morphology and type C, D and E morphologies are site density and length. Types A and B have high density and long length, whereas types C, D and E have low density and/or short length.

FIG. 11A-FIG. 11F show various SEM micrographs of high density ZnO nanowires grown on carbon cloth. FIG. 11A shows a low magnification image of the carbon cloth prior to growth. FIG. 11B shows a high magnification image of the carbon cloth prior to growth. FIG. 11C shows a low magnification image of type A samples which exhibit non-uniform, long length and high density. FIG. 11D shows a high magnification image of the type A samples showing non-uniform long length and high density. FIG. 11E shows a low magnification image of type B samples showing the uniform long length and high density. FIG. 11F shows a high magnification of type B samples showing the uniform long length and high density. The scale bars of FIG. 11A are 100 µm; the scale bars of FIG. 11B-FIG. 11E is 10 µm; and the scale bar of FIG. 11F is 2 µm.

FIG. 11A and FIG. 11B are the SEM images of the carbon fibers before ZnO nanowire growth. FIGS. 11C-11F show the morphology of high density and long length ZnO nanowires on carbon cloth.

Figure 12:
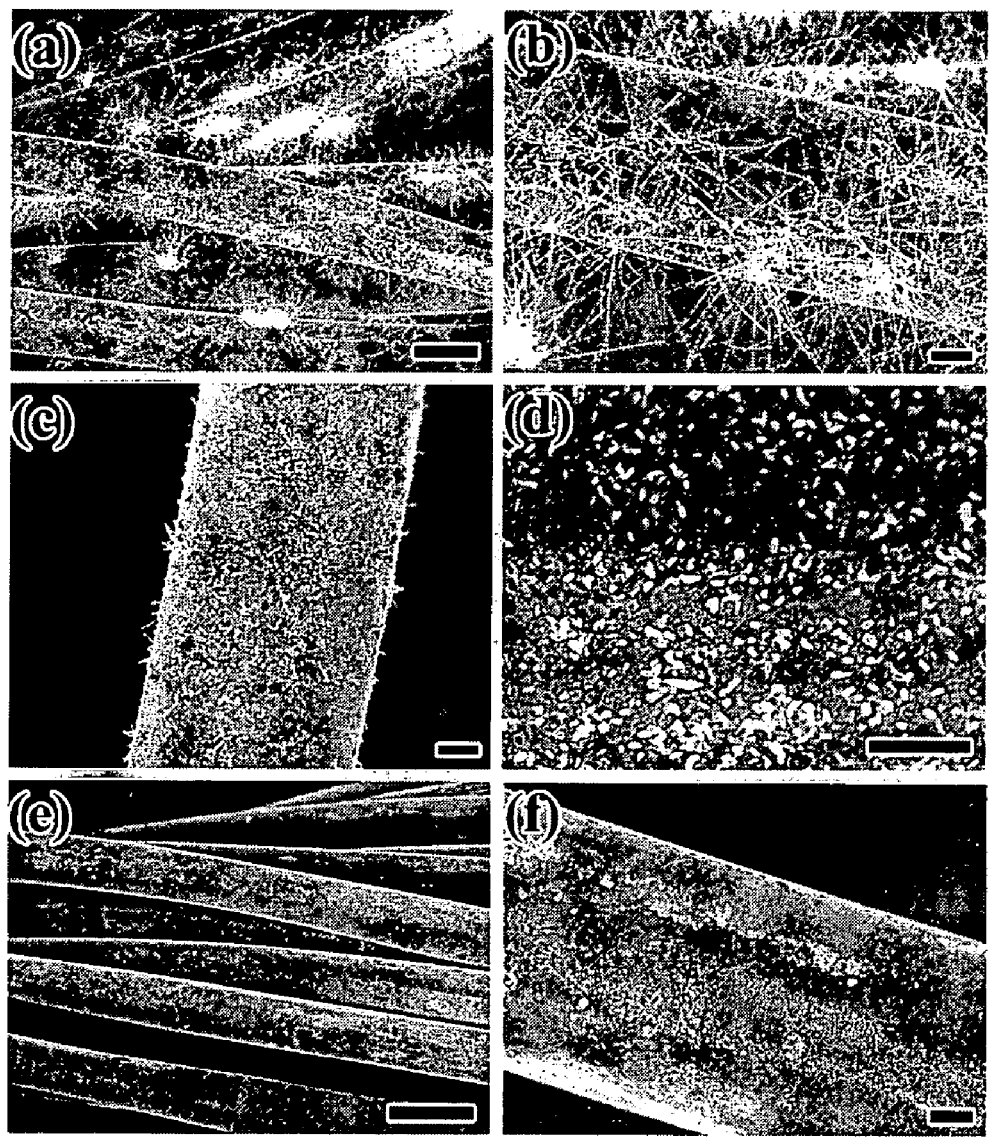
FIG. 12A-FIG. 12F show SEM micrographs illustrating low density ZnO nanowires, nanorods, and nanoclusters grown on carbon fibers.

FIG. 12A-FIG. 12F show various SEM micrographs illustrating the low density ZnO nanowires, nanorods, and nanoclusters grown on carbon fibers. FIG. 12A shows a low magnification image and FIG. 12B shows a high magnification image of type C morphology samples to illustrate the low density and long length. FIG. 12C shows a low magnification image and FIG. 12D shows a high magnification image of type D morphology to show the short nanorods with uniform length. FIG. 12E shows a low magnification image and FIG. 12F shows a high magnification image of type E samples to show the small ZnO nano-cluster on the surface. The scale bar of FIG. 12A is 10 µm; the scale bar of FIG. 12B is 2 µm; the scale bar of FIG. 12C and FIG. 12D is 1 µm; the scale bar of FIG. 12E is 10 µm; and the scale bar of FIG. 12F µm.

More specifically, FIG. 12A-FIG. 12F shows the morphology of low density nanowires, nanorods and nanoclusters. According to the classification system discussed above (see Table II), FIGS. 11C and 11D illustrate type A samples, while FIG. 11E and FIG. 11F illustrate type B samples. FIGS. 12A and 12B illustrate type C samples. FIG. 12C and FIG. 12D illustrate type D samples. FIG. 12E and FIG. 12F illustrate type E samples. For type D, shown in FIGS. 12C and 12D, high resolution shows that they are only about 500 nm long to about 900 nm long with a blunt head, in contrast to types A, B and C, where nanowires have a sharp tip. Due to the very short growth time and low temperature, type E shows only ZnO nanoclusters.

Figure 13:
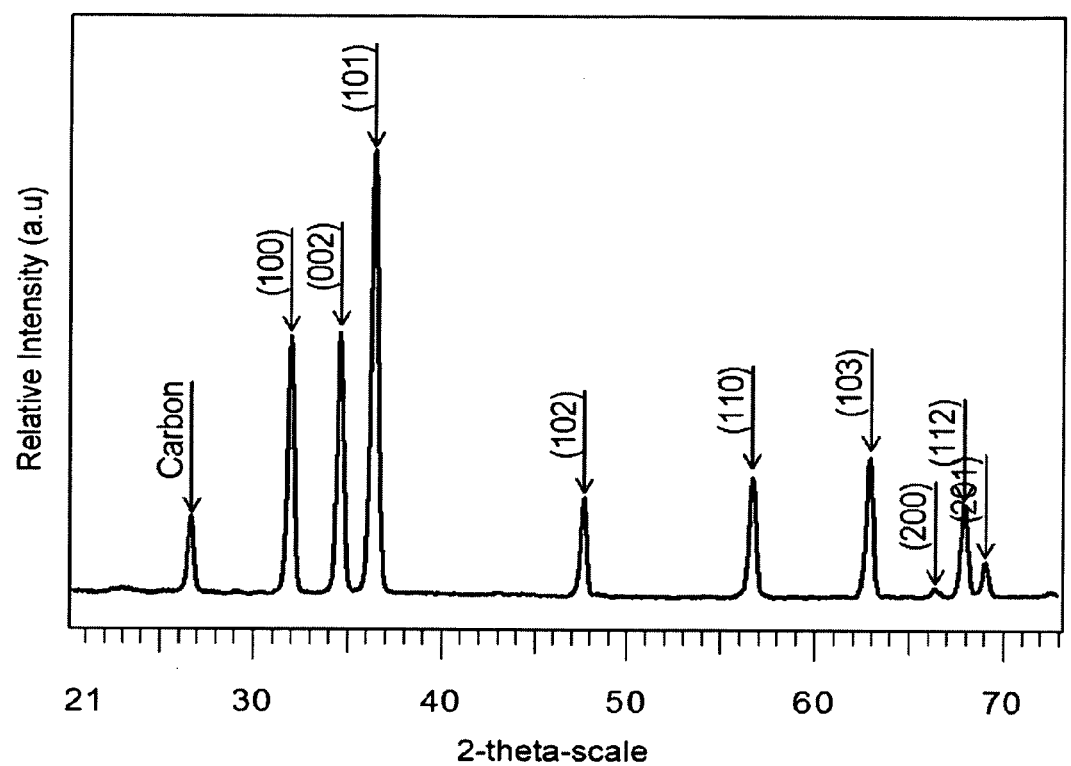
FIG. 13 shows an x-ray diffraction (XRD) of ZnO nanowires grown on carbon cloth.

The crystallinity of the ZnO nanowires grown on carbon cloth was studied by x-ray diffraction (XRD) and displayed graphically in FIG. 13. Clearly, the ZnO nanowires are highly crystallized with a typical wurtzite hexagonal structure like bulk ZnO with unit cell constants of a=3.248 Å and c=5.206 Å. A strong peak at 2θ=26.6° is originated from the graphite layers of carbon cloth substrate.

Figure 14:
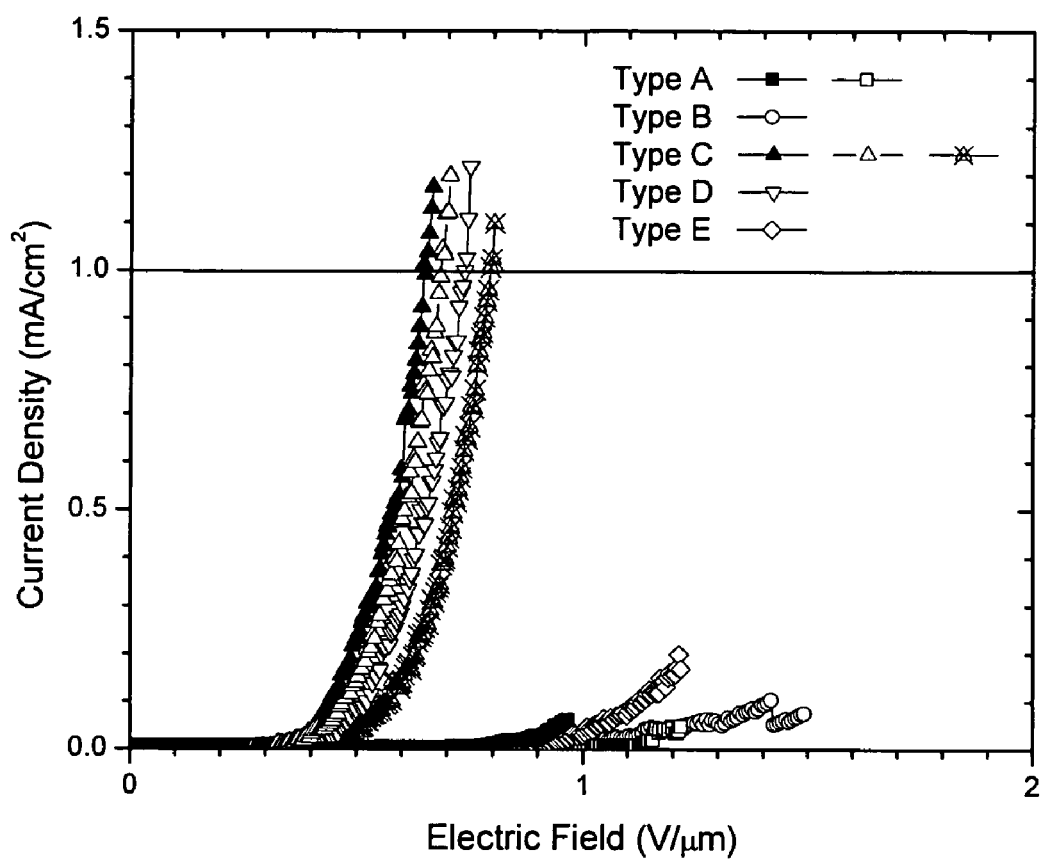
FIG. 14 shows a graph of field emission current density dependencies on electric field of a variety of ZnO nanowires grown on carbon cloth.
Figure 15:
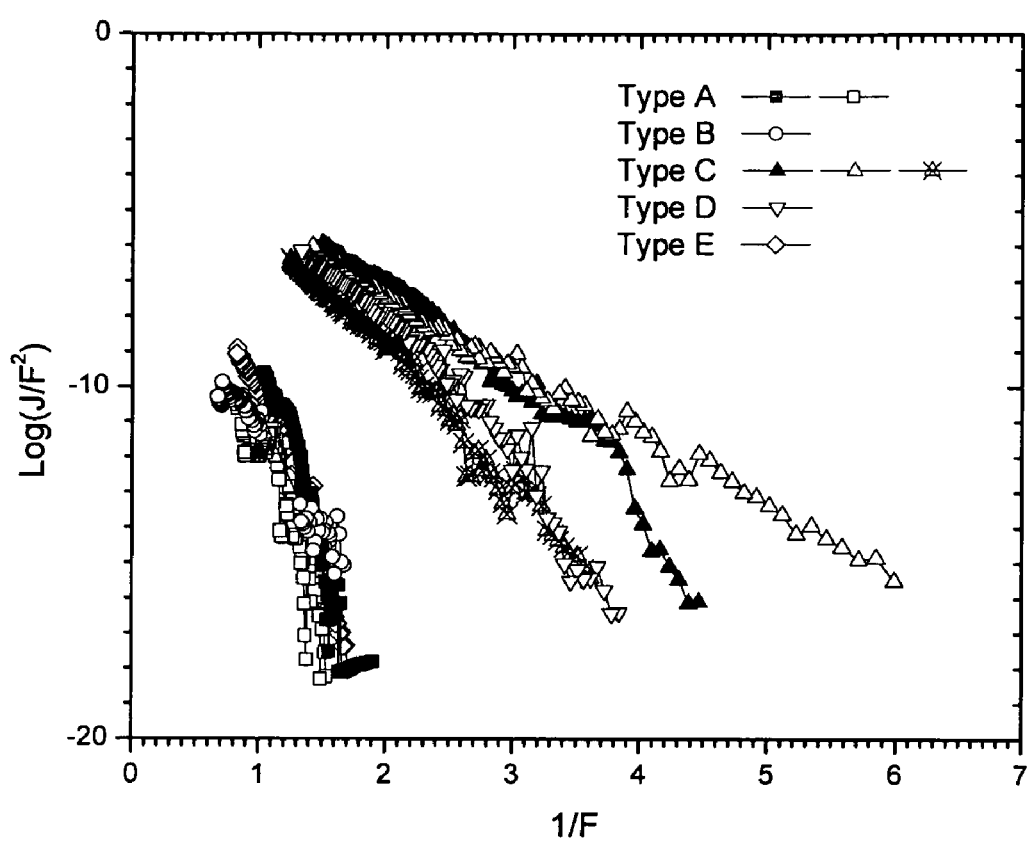
FIG. 15 shows various Fowler-Nordheim plots of all curves shown in FIG. 14.

FIG. 14 shows field current density dependencies on electric field of a variety of ZnO nanowires grown on carbon cloth. Field emission properties of all these samples were measured using a simple diode configuration. The field emission current density dependencies of the macroscopic electric field are shown in FIG. 14. The data can be treated in 2 groups—types A, B, and E represent group 1, and types C and D represent group 2. For group 2, an emission current density of about 1 mA/cm$^2$ was obtained at an electric field of about 0.6 V/µm to about 0.8 V/µm. On the other hand, group 1, with a turn-on electric field higher than that of group 2, never reached an emission current density of about 1 mA/cm$^2$ because of sever arcing between the cathode and the anode during the measurements. The clear grouping of field emission characteristics is further demonstrated by the Fowler-Nordheim (F-N) plot shown in FIG. 15.

Figure 16:
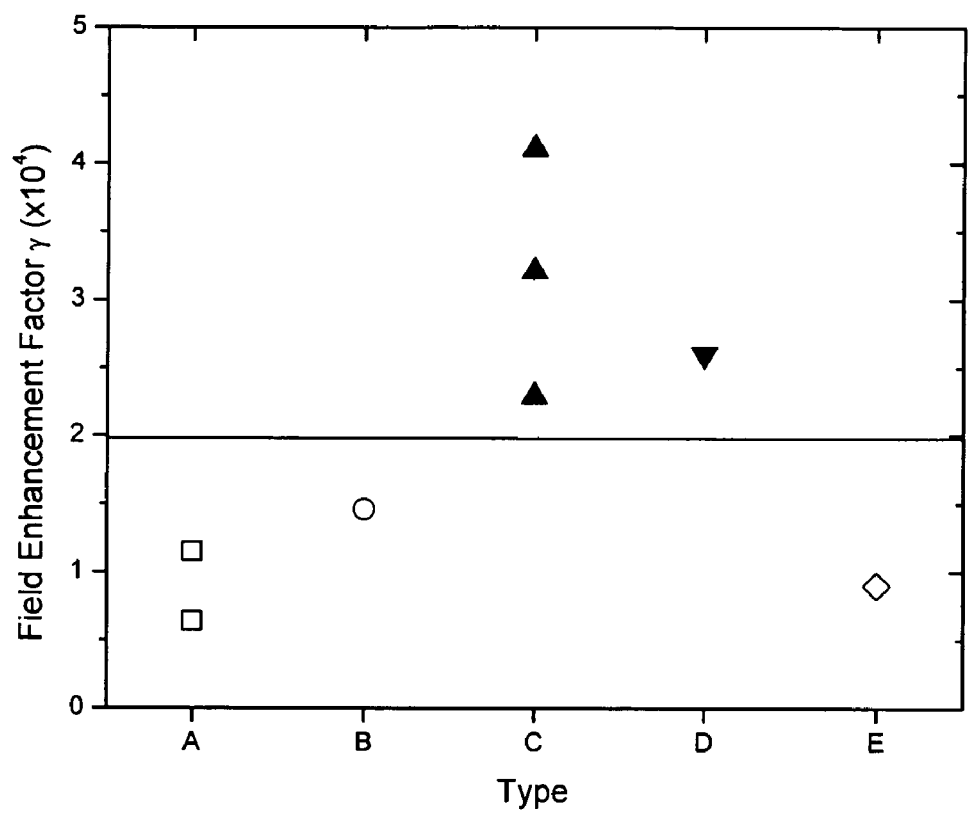
FIG. 16 shows a graph of field enhancement factors for various types of nanostructures.

The field emission data fit, in general, to the linear relationship given by, $$\log(J/F^2) = \log(A\gamma^2/\phi) - B\phi^{3/2}/\gamma F,$$

where $A=1.54 \times 10^{-6}$ A eV V$^{-2}$, $B=6.83 \times 10^9$ eV$^{-3/2}$ Vm$^{-1}$, $\gamma$ is the field enhancement factor, and $\phi$ is the work function of the emitter material. Assuming $\phi=5.3$ eV as for ZnO, the field enhancement factors can be calculated from the slope of F-N plots in FIG. 15, and are plotted in FIG. 16. From FIG. 16, it can be seen that the field enhancement factor for group 1 is lower than $2 \times 10^4$, whereas it is much higher than $2 \times 10^4$ for group 2. The highest value of field enhancement factor is $4.11 \times 10^4$.

It is not difficult to understand the very high field enhancement factor for type C because of the low density and long length, as shown in FIG. 12A and FIG. 12B, but surprising for type D since the ZnO nanorods in type D are very short and have a very low aspect ration. As such, the carbon fiber is material to the ability of the device to achieve a high field enhancement factor. Carbon fibers in carbon cloth have an intrinsic field enhancement factor of about $0.9 \times 10^4$.

Figure 11:
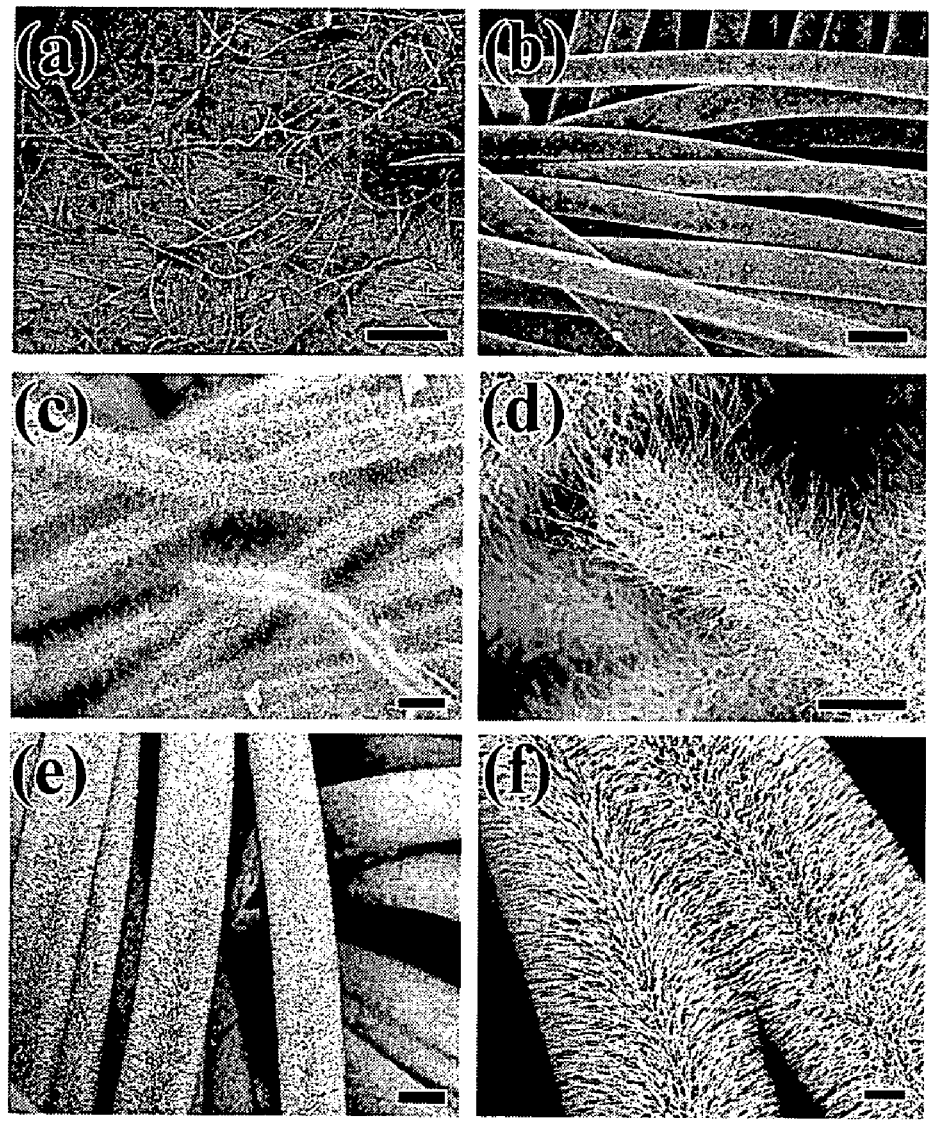
FIG. 11A-FIG. 11F show various SEM micrographs of high density ZnO nanowires grown on carbon cloth.

The grouping of field emission characteristics can be correlated with the morphology of ZnO nanowires on carbon cloth. For example, the ZnO nanowires in type A and type B are dense, as shown in FIG. 11, but sparse in type C. Since the field enhancement factor of dense nanostructured materials is reduced as a result of the screening effect, types A and B show worse field emission than type C. When the density is too high, the length of each ZnO nanowire does not appear to make a material difference. Alternatively, compared with type D morphology, type E has too short a length to obtain high field enhancement factor, even though the density of ZnO nanoclusters is very low.

In summary, it has been demonstrated that exceptionally high field emission of ZnO nanowires grown on carbon cloth has been achieved. The electric field required to reach about 1 mA/cm$^2$ is about 0.7 V/µm, a value lower than any other known reported value. The exceptionally high field enhancement factor (about $4.11 \times 10^4$) results from not only the intrinsic geometry of ZnO nanowires but also the unique geometry of the carbon cloth. A comparative study of field emission from nanowires of various morphologies and site densities has led to the conclusion that the length, the nanostructure density and the substrate geometry are material to achieving these field emission properties.

Experimental

A mixture of an equal amount of ZnO powder (Alfa Aesar, 99.9%) and graphite powder (Alfa Aesar, 99.9%) was prepared as the source and placed at one end of a quartz boat. In the same boat, a few pieces of carbon cloth were placed at various distances from the source down the vapor flow direction, corresponding to different temperature regions, to collect nanowires. The entire assembly was then placed inside a horizontal tube furnace and heated up to about 1100° C. at a rate of about 50° C. per minute and kept for various time (between about 15 and about 45 minutes) with a pressure of about 2 Torr maintained by a constant Argon gas flow of 50 sccm. After the furnace was cooled down, a bluish white product was observed on the carbon cloth surface.

Field emission properties of all these samples were measured using a simple diode configuration. The anode was a molybdenum disk with a diameter of about 5 mm, and the gap between the sample and anode was about 2.5 mm. The vacuum level was kept below about $1 \times 10^{-6}$ Torr during measurements.

The morphology and the structural characterization were done by scanning electron microscopy (SEM, JEOL-6340F) and Bruker-AXS X-ray diffractometry (G8 GADDS).

All patents, patent applications, and published references cited herein are hereby incorporated by reference in their entirety. While this invention has been particularly shown and described with references to preferred embodiments thereof, it will be understood by those skilled in the art that various changes in form and details may be made therein without departing from the scope of the invention encompassed by the appended claims.

What is claimed is:

1. A method of providing an enhanced field emission current density, comprising:
   providing a conductive cloth substrate woven of fiber bundles oriented in at least two directions, wherein the conductive cloth substrate has a rough finish;
   growing a plurality of nanostructures on the conductive cloth substrate; and
   delivering an electric field to the conductive cloth substrate.

2. The method of claim 1 wherein the nanostructures are carbon nanostructures.

3. The method of claim 1 wherein the field emission current density is about 1 mA/cm$^2$.

4. The method of claim 1 wherein the conductive cloth substrate is a carbon cloth.

5. The method of claim 1 wherein the conductive cloth substrate comprises a material from the group consisting of silver, copper, zinc, gold, gallium, indium, thallium, tin, antimony, and bismuth.

6. The method of claim 1 wherein the nanostructure comprises zinc oxide.

7. The method of claim 1 wherein the conductive cloth comprises a plurality of fibers in a first direction and a plurality of fibers in a second direction.

8. A method of providing an enhanced field emission current density, comprising:
   providing a conductive cloth substrate woven of fibers oriented in at least two directions, wherein the conductive cloth substrate has a rough finish;
   growing a plurality of nanostructures on the conductive cloth substrate via a carbothermal vapor transport and condensation approach; and
   delivering an electric field to the conductive cloth substrate.

9. The method of claim 8 wherein the conductive cloth substrate is a carbon cloth.

10. The method of claim 8 wherein the nanostructures comprise zinc oxide.

11. The method of claim 8 wherein the conductive cloth substrate comprises a material selected from the group consisting of silver, copper, zinc, gold, gallium, indium, thallium, tin, antimony, and bismuth.

12. The method of claim 8 wherein the conductive cloth substrate comprises a plurality of fibers in a first direction and a plurality of fibers in a second direction.

13. A device capable of delivering an enhanced field emission current density at a low electric field comprising:
   a conductive cloth substrate woven of fiber bundles oriented in at least two directions, wherein the conductive cloth substrate has a rough finish; and
   a plurality of nanostructures grown on the conductive cloth substrate.

14. The device of claim 13 wherein the conductive cloth substrate is a carbon cloth.

15. The device of claim 14 wherein the carbon cloth comprises a plurality of fibers in a first direction and a plurality of fibers in a second direction.

16. The device of claim 13 wherein the conductive cloth substrate comprises a material selected from the group consisting of silver, copper, zinc, gold, gallium, indium, thallium, tin, antimony, and bismuth.

17. The device of claim 13 wherein the nanostructures are carbon nanotubes.

18. The device of claim 13 wherein the nanostructures comprise zinc oxide.

19. The device of claim 13 wherein the conductive cloth substrate comprises a plurality of fibers in a first direction and a plurality of fibers in a second direction.

* * * * *